United States Patent [19]

Farber et al.

[11] Patent Number: 5,496,684

[45] Date of Patent: Mar. 5, 1996

[54] PHOTOSENSITIVE COMPOSITIONS AND ELEMENTS FOR FLEXOGRAPHIC PRINTING

[75] Inventors: Milton Farber, Cheshire, Conn.; David T. Hughes, Kennedale, Tex.

[73] Assignee: Chase Elastomer Corporation, Kennedale, Tex.

[21] Appl. No.: 122,400

[22] Filed: Sep. 17, 1993

[51] Int. Cl.$^6$ ............................... G03F 7/00; G03F 7/038
[52] U.S. Cl. ................... 430/306; 430/281.1; 430/286.1; 430/309
[58] Field of Search .................................. 430/286, 281, 430/306, 309

[56] References Cited

U.S. PATENT DOCUMENTS

| | | | |
|---|---|---|---|
| 3,239,478 | 3/1966 | Harlan, Jr. | 260/27 |
| 3,265,765 | 8/1966 | Holden et al. | 260/876 |
| 3,674,486 | 7/1972 | Milgrom . | |
| 4,188,223 | 2/1980 | Woodbrey et al. | 430/270 |
| 4,197,130 | 4/1980 | Nakamura et al. | 430/286 |
| 4,264,705 | 4/1981 | Allen | 430/271 |
| 4,266,005 | 5/1981 | Nakamura et al. | 430/271 |
| 4,266,007 | 5/1981 | Hughes et al. | 430/306 |
| 4,320,188 | 3/1982 | Heinz et al. | 430/281 |
| 4,323,636 | 4/1982 | Chen | 430/27 |
| 4,323,637 | 4/1982 | Chen et al. | 430/271 |
| 4,391,949 | 7/1983 | St. Clair | 525/99 |
| 4,400,459 | 8/1983 | Gruetzmacher et al. | 430/306 |
| 4,431,723 | 2/1984 | Proskow | 430/286 |
| 4,452,879 | 6/1984 | Fickes et al. | 430/306 |
| 4,686,172 | 8/1987 | Worns et al. | 430/286 |
| 4,894,315 | 1/1990 | Feinberg et al. | 430/281 |
| 4,957,850 | 9/1990 | Kusuda et al. | 430/271 |
| 4,960,746 | 10/1990 | Hüsler et al. | 430/281 |
| 4,980,269 | 12/1990 | Sakurai et al. | 430/283 |
| 5,073,477 | 12/1991 | Kusuda et al. | 430/287 |
| 5,104,921 | 4/1992 | Erickson et al. | 524/274 |
| 5,135,837 | 8/1992 | Swatton | 430/273 |
| 5,247,026 | 9/1993 | Erickson et al. | 525/331.9 |
| 5,364,741 | 11/1994 | Huynh-Tran et al. | 430/306 |

FOREIGN PATENT DOCUMENTS

| 1267475 | 4/1990 | Canada . |
|---|---|---|
| 0027612 | 4/1981 | European Pat. Off. . |

OTHER PUBLICATIONS

Database WPI, Section Ch, Week 8819, Derwent Publications Ltd., London, GB; Class A89, AN 88–128571 and JP, A, 63 070 242 (Nippon Zeon KK), 30, Mar. 1988, see Abstract.

*Primary Examiner*—Janis L. Dote
*Attorney, Agent, or Firm*—Charles D. Gunter, Jr.; Susan L. Firestone

[57] ABSTRACT

The invention involves a photosensitive composition and a printing element made from the photosensitive composition as well as a method of making the printing element. The photosensitive composition is made from a blend of a crosslinking photoinitiator with an asymmetric, multibranched, block copolymer containing (a) a polymer block A having at least predominantly a polymerized alkenyl arene block, (b) a polymer block B having at least predominantly a polymerized conjugated diene block, (c) a polymer block C having at least predominantly a polymerized conjugated diene block, and (d) the residue of a multifunctional coupling agent. Block A and block B form the structure A-B and the multifunctional coupling agent is between at least one block C and the block B of at least one A-B. The photosensitive composition may optionally include an ethylenically unsaturated crosslinking agent.

5 Claims, No Drawings

PHOTOSENSITIVE COMPOSITIONS AND ELEMENTS FOR FLEXOGRAPHIC PRINTING

BACKGROUND OF THE INVENTION

1. Field of the Invention

The invention relates to photosensitive, elastomeric, flexographic printing compositions based on asymmetric, multi-branched, block copolymers and the printing elements derived from such compositions.

2. Description of the Prior Art

Photosensitive printing plates used for flexographic printing are characterized by their ability to crosslink or cure upon exposure to actinic radiation. For the production of such printing plates, a template, such as a photographic negative or transparency, is put onto an unexposed plate containing a layer of photosensitive material. The plate is exposed to actinic radiation, such as a UV or black light. The actinic radiation enters the photosensitive material through the clear areas of the transparency and is blocked from entering the black or opaque areas. The exposed material crosslinks and becomes insoluble to solvents used during image development. The unexposed photopolymer areas under the opaque regions of the transparency remain soluble and are washed away with a suitable solvent leaving the desired image as a relief, an intaglio or a combination of both. Then the plate is dried. The printing plate can be further treated to remove surface tackiness and subsequently exposed to additional actinic radiation to ensure complete photopolymerization and final plate hardening. After these steps, the plate is mounted on a cylinder and used for printing.

Common defects of existing photopolymer printing plates are poor ink transfer and uneven impression. Other common defects include a lack of flexibility and resilience as well as poor durability. The present invention discloses compositions that exhibit significant improvement in these properties.

Photosensitive elements of the flexographic printing plates generally involve compositions containing an elastomeric or thermoplastic-elastomeric polymer; an addition polymerizable, nongaseous, ethylenically unsaturated, monomeric crosslinker and a photoinitiator activated by actinic radiation. Such photopolymer printing plates usually contain large amounts of the ethylenically unsaturated monomeric crosslinkers (10% and higher) that are undesirable due to the toxicity, high cost, and post processing extractibility of unpolymerized material.

One object of the invention is to produce a photosensitive composition that crosslinks with little or no ethylenically unsaturated crosslinking agents.

Another object of the invention is to produce a photosensitive composition and an element for flexographic printing that are soft, flexible, resilient and durable, and show no loss in dimensions or properties during use.

A third object of the invention is to produce a stable photosensitive composition and an element for flexographic printing. This composition requires no aging before use, yet can be stored for long periods of time without changing its photospeed and exposure latitude.

SUMMARY OF THE INVENTION

The invention involves a photosensitive elastomer composition that forms the photosensitive layer of a printing element and a method of forming a relief or intaglio image on the printing element. The photosensitive composition comprises a crosslinking photoinitiator blended with an asymmetric, multi-branched, block copolymer containing:

(a) a polymer block A having at least predominantly a polymerized alkenyl arene block and a weight average molecular weight of about 3,000 to about 125,000, (b) a polymer block B having at least predominantly a polymerized conjugated diene block and a weight average molecular weight of about 15,000 to about 250,000, (c) a polymer block C having at least predominantly a polymerized conjugated diene block and a weight average molecular weight of about 15,000 to about 250,000, and (d) the residue of a multifunctional coupling agent.

Block A and block B of the above described composition form the structure A-B and the multifunctional coupling agent is between at least one block C and the block B of at least one A-B block. A, B and C blocks may be either homopolymer, random or tapered copolymer blocks as long as each block contains a predominant amount of at least one class of the monomers defined above. Optionally, the photosensitive composition may also include an ethylenically unsaturated crosslinking agent.

The photosensitive printing element of the invention comprises a layer of the above described photosensitive composition and a support means. Other additives known in the art, such as plasticizers, stabilizers, antioxidants, antiozonants, process aids and colorants may also be added.

Additional effects, features and advantages will be apparent in the written description that follows.

DETAILED DESCRIPTION OF THE INVENTION

The invention relates to photosensitive elastomeric compositions based on asymmetric, multi-branched, block copolymers having the residue of a multifunctional coupling agent. The structure, composition and method of manufacturing such polymers are described in U.S. Pat. Nos. 4,391,949 and 5,104,921, and are incorporated herein by reference. Surprisingly, such block copolymers when blended with a crosslinking photoinitiator crosslink by actinic radiation with little or no ethylenically unsaturated crosslinking agents.

The asymmetric, branched, block copolymer contains:

(a) a polymer block A having at least predominantly a polymerized alkenyl arene block and a weight average molecular weight of about 3,000 to about 125,000, (b) a polymer block B having at least predominantly a polymerized conjugated diene block and a weight average molecular weight of about 15,000 to about 250,000, (c) a polymer block C having at least predominantly a polymerized conjugated diene block and a weight average molecular weight of about 15,000 to about 250,000, and (d) the residue of a multifunctional coupling agent;

wherein block A and block B form the structure A-B and the multifunctional coupling agent is between at least one block C and the block B of at least one A-B block. A, B and C blocks may be either homopolymer, random or tapered copolymer blocks as long as each block contains a predominant amount of at least one class of the monomers defined above.

Preferred polymers used in the invention are asymmetric, star-shaped block copolymers of the structure

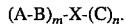

$(A-B)_m-X-(C)_n$.

The letter X refers to the residue of the multifunctional coupling agent. The letters m and n refer to the relative number of branches or arms in each polymer molecule. Therefore, m and n are integers when referring to a single polymer molecule. A polymer mass may contain molecules of varying functionality. The copolymer has between at least 3 arms and about 40 arms, preferably at least 6 arms and fewer than 40 arms. Thus, $3<m+n\leq40$, most preferably $6<m+n\leq40$.

The alkenyl arenes in block A are preferably monoalkenyl arenes. Block A may contain copolymers of two or more alkenyl arenes, for example, styrene/α-methylstyrene copolymer blocks, or alkenyl styrene/conjugated diene random or tapered copolymer blocks as long as the blocks A individually at least predominate in alkenyl arenes, that is, greater than 50% by weight. The alkenyl arene content of block A is preferably from about 80% to 100% by weight, more preferably 100% by weight.

The term "monoalkenyl arene" includes particularly those of the benzene series such as styrene and its analogs and homologs, including α-methylstyrene, t-butylstyrene, o-methylstyrene, p-methylstyrene, p-butylstyrene, 1,3-dimethylstyrene, and other ring alkylated styrenes, particularly ring methylated styrenes, and other monoalkenyl polycyclic aromatic compounds such as vinylnaphthalene, vinylanthracene and the like, as well as mixtures of the same. The preferred monoalkenyl arenes are monovinyl monocyclic arenes such as styrene and α-methylstyrene. Styrene is most preferred.

The B and C polymer blocks of conjugated dienes may include homopolymers of conjugated diene monomers and copolymers of two or more conjugated dienes, and mixtures thereof, as well as copolymers of at least one or more conjugated dienes with at least one monoalkenyl arene as long as the conjugated diene predominates. Preferably the amounts of randomly copolymerized alkenyl arene units or short runs (sequences) of such units is minimized, preferably less than about 10% by weight of the conjugated diene and more preferably 0%.

The conjugated dienes are preferably ones containing from 4 to 8 carbon atoms. Examples of conjugated dienes include 1,3-butadiene (butadiene) and 2-methyl-1,3-butadiene (isoprene) and their homologs and analogs, such as 2,3-dimethylbutadiene; 1,3-pentadiene (piperylene); 1,3-hexadiene; and the like, as well as mixtures thereof. The preferred conjugated dienes are butadiene and isoprene, while isoprene is most preferred. While the conjugated dienes in block B may differ from that in block C, it is preferred that the same diene is used in both blocks.

The block copolymers of conjugated dienes and alkenyl arene hydrocarbons include any of those that exhibit elastomeric properties. The block copolymer has the characteristics of a thermoplastic elastomer when the alkenyl arene content is not more than about 60% by weight, preferably not more than about 55% by weight.

The multifunctional coupling agent residue is the residue of any coupling agent that has at least two reactive sites and can form star-shaped polymers, although a polyalkenyl aromatic coupling agent is preferred. Coupling agents are well known in the art and are disclosed in the above-incorporated patents. More preferred coupling agents are polyvinyl aromatic compounds that are also known in the art and are also disclosed in the above-incorporated patents. Examples are 1,2-divinylbenzene; 1,3-divinylbenzene; 1,4-divinylbenzene; 1,2,4-trivinylbenzene; 1,3-divinylnaphthalene; 1,8-divinylnaphthalene; 1,3,5-trivinylnaphthalene; 2,4-divinylbiphenyl; 2,5,4'-trivinylbiphenyl; 1,2-divinyl-3,4-dimethylbenzene; 1,5,6-trivinyl-3,7-diethylnaphthalene; 1,3-divinyl-4,5,6-tributylnaphthalene; 2,2'-divinyl-4-ethyl-4'-propylbiphenyl; and the like. Divinyl aromatic hydrocarbons containing up to 26 carbon atoms per molecule are most preferred, most particularly divinylbenzene in either its ortho, meta or para isomer and commercial divinylbenzene which is a mixture of the above isomers.

The star-shaped polymers are characterized by having a number of arms of substantially linear unsaturated polymers extending outwardly from a dense nucleus of crosslinked poly(polyalkenyl coupling agent). The number of arms varies considerably, but typically is between 3 and 40.

Most preferably, the polymer is a star-shaped, isoprene-styrene block copolymer having greater than about 6 arms but fewer than about 40 arms of isoprene, a divinylbenzene residue, a weight average molecular weight of about 1.2 million and a polystyrene content of about 10% by weight. This block copolymer is available from Shell Chemical Co., Houston, Tex., as KRATON® D-1320X rubber.

These photosensitive compositions may also include blends of other block copolymers. Examples of such blends are the asymmetric, star-shaped block copolymer described above with a linear triblock copolymer, a symmetric, radial block copolymer or a diblock copolymer. Although no exact ratio is preferred, blends with at least about 25% by weight of asymmetric block copolymer and other block copolymers can be used.

Actinic radiation sensitive, crosslinking and/or addition polymerization photoinitiators initiate addition polymerization or crosslinking of the above elastomeric block copolymers without excessive termination when exposed to actinic radiation. These photoinitiators are thermally inactive at or below 185° C. and may include a combination of initiators to form a free radical generating system. Therefore in this disclosure, the term "crosslinking photoinitiator" refers to one photoinitiator or a system of crosslinking and/or addition polymerization initiators that generate free radicals upon actinic radiation exposure. These photoinitiators are well known in the art and examples of these are described in U.S. Pat. No. 4,686,172. The photoinitiators include aromatic ketones such as benzophenone and substituted benzophenones, the substituted or unsubstituted polynuclear quinones which are compounds having two intracyclic carbon atoms in a conjugated six-membered carbocyclic ring and having at least one aromatic carbocyclic ring fused to the ring containing the carbonyl groups, and mixtures thereof. Examples of photoinitiators include: 2,2-dimethoxy-2-phenylacetophenone, benzophenone, 1-hydroxycyclohexylphenyl ketone, 2,4,6-trimethylolbenzophenone, 4-methylbenzophenone, oligo-(2-hydroxyphenyl)propane, 2-benzyl-2-N,N-dimethylamino-1-(4-morpholinophenyl)-1-butane, 9,10-anthraquinone, 1-chloroanthraquinone, 2-chloroanthraquinone, 2-methylanthraquinone, 2-t-butylanthraquinone, octamethylanthraquinone, 1,4-naphthoquinone, 9,10-phenanthraquinone, 1,2-benzanthraquinone, 2,3-benzanthraquinone, 2-methyl-1,4-napthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone α-sulfonic acid, 3-chloro-2-methylanthraquinone, retenequinone, 7,8,9,10-tetrahydronaphthacenequinone, and 1,2,3,4-tetrahydrobenz-α-anthracene-7,12-dione and mixtures thereof. Other photoinitiators that are useful for the purpose of this invention are described in U.S. Pat. No. 2,760,863 and include vicinal ketaldonyl compounds such as diacetyl benzil, and the like, α-ketaldonyl alcohols, such as benzoin, pivaloin, and the like, α-hydrocarbon substituted aromatic acyloins, including α-methylbenzoin, α-allylbenzoin and α-phenylbenzoin and 2,2 dialkoxy-2-phenylacetophenone. Preferred photoinitiators are aromatic ketones and their mixtures, such as the benzophenones and substituted benzophenones. Particularly preferred photoinitiators are 2,2-dimethoxy-2-phenylacetophenone, benzophenone, 1-hydroxycyclohexylphenyl ketone, 2,4,6-trimethylolbenzophenone, 4-methylbenzophenone, oligo-(2-hydroxy-phenyl) propane, 2-benzyl-2-N,N-dimethylamino- 1-(4-morpholinophenyl)-1-butane and mixtures thereof. A benzophenone and hydroxycyclohexylphenyl ketone mixture (IRGACURE 500, Ciba-Geigy Corp., Hawthorne, N.Y.) combined with 2,4,6-trimethylolbenzophenone, 4-methylbenzophenone and oligo-( 2-hydroxy-phenyl)-propane mixture (ESACURE KT37, Sartomer Co., Exton, Pa.) is most preferred.

The photosensitive elastomer composition is formed by combining block copolymers with crosslinking photoinitiators at a concentration sufficient to initiate polymerization of the composition upon exposure to actinic radiation. Preferably, the concentration of photoinitiator ranges from about 0.1 to about 15 parts by weight per hundred parts by weight elastomeric polymer (php). More preferably, the photoinitiator is at a concentration of about 1 to about 15 php, most preferably about 1 to about 8 php.

Surprisingly, when exposed to actinic radiation, the photosensitive composition of the invention crosslinks without using an ethylenically unsaturated crosslinking agent and yields a usable flexographic plate. With other hydrocarbon block copolymers known in the art, such as the linear A-B-A type, usable products require the presence of at least 1% by weight, preferably at least 5% of an ethylenically unsaturated crosslinking agent.

If desired, up to 20 php of photopolymerizable, ethylenically unsaturated, crosslinking agents may be employed. These crosslinking agents include unsaturated esters of polyols, particularly such esters with α-methylene carboxylic acids. Typical crosslinking agents used in the industry are described in U.S. Pat. No. 4,686,172 and include ethylene glycol diacrylate, diethylene glycol diacrylate, glycerol diacrylate, glycerol triacrylate, mannitol polyacrylate, sorbitol polyacrylate, ethylene glycol dimethacrylate, 1,3-propanediol dimethacrylate, 1,3,4-butanetriol trimethacrylate, 1,4-butanediol diacrylate or dimethacrylate, 1,6-hexanediol diacrylate, 1,6-hexanediol dimethacrylate, 1,4-cyclohexanediol diacrylate, 1,4-benzenediol dimethacrylate, isosorbidene diacrylate, pentaerythritol di- tri- or tetramethacrylate or tetraacrylate, dipentaerythritol polyacrylate, 1,3-propanediol diacrylate, 1,6-hexanediol diacrylate or dimethacrylate, 1,5-pentanediol dimethacrylate, trimethylolpropane triacrylate and trimethacrylate, the bisacrylates and meth-acrylates of polyethylene glycols of 200 to 4000 molecular weight, unsaturated amides, particularly those of the α-methylene carboxylic acids and especially those of α, ω-diamines and oxygen-interrupted ω-diamines such as methylene bisacrylamide, methylene bismethacrylamide, ethylene bismethacrylamide, 1,6-hexamethylene bisacrylamide, diethylenetriamine trismethacrylamide, 1,2-di(γ-methacrylamidopropoxy)ethane, beta-methacrylaminoethyl methylacrylate, N-(beta-hydroxyethyl)-2-(methacrylamido)ethyl acrylate and N,N-bis(β-methacryloxethy)acrylamide; vinyl esters such as divinyl succinate, divinyl adipate, divinylphthalate, divinyl terepthalate, divinyl benzene-1,3-disulfonate, divinyl butane-1,4-disulfonate and unsaturated aldehydes, such as sorbaldehyde (hexadienal) and their mixtures. Preferred ethylenically unsaturated, crosslinking agents are the esters and amides of α-methylene carboxylic acids and substituted carboxylic acids with polyols and polyamines, wherein the molecular chain between the hydroxyls and amino groups is solely carbon or oxygen-interrupted carbon. The optional addition of the above crosslinking agents in amounts up to about 20 php yields high quality products, with up to about 1 part by weight per 100 parts by weight elastomeric polymer most preferred. Due to the known toxicity and high costs associated with some ethylenically unsaturated crosslinking agents, their total absence or presence in small amounts (<1 part by weight per 100 parts by weight elastomeric polymer) is advantageous and preferred.

The photosensitive compositions may also include materials that act as actinic radiation absorbers which enhance the ability of the photopolymer printing plate to reproduce a wide range of detail with a single exposure to the actinic radiation, thus improving the exposure latitude. These compositions are disclosed in Applicant's U.S. patent application Ser. No. 08/122,682, Hughes, D. T. and Farber, M., filed Sep. 17, 1993 herewith and assigned to the assignee of the current invention and incorporated herein by reference.

The photosensitive compositions described above are usually compounded with additional materials to improve resistance to thermal oxidation and ozone attack during manufacture and use, to improve processing and to reduce hardness of the finished printing plate. Colorants, fillers, and the like may also be added. Additives that impart resistance to thermal oxidation are well known in the art and include substituted phenols, such as p-methoxyphenol; alkylated phenols, such as 2,6-di-t-butyl- 4-ethylphenol; alkylated phenols, such as 2-methylenebis( 4-methyl-6-butylphenol), 1,3,4-trimethyl-2,4,6-tris( 3,5-di-t-butyl-4-hydroxybenzyl) benzene, 2(4-hydroxy- 3,5-t-butylanilino)-4,6-bis(n-octylthio) 1,3,5-triazone, tetrakis(methylene(3,5-di-t-butyl-4-hydroxy hydrocinnamate)) methane; hydroquinones such as hydroquinone, and alkyl and aryl-substituted hydroquinones; p-toluquinone and chloranil; t-butylpyrocatechol, pyrogallol, β-naphtho-2,6-di-t-butyl-p-cresol; polymerized trimethyl dihydroquinone, naphtholamines, zinc dibutyl-dithiocarbamate and dilaurylthiodipropionate, phenothiazine, pyridine, nitrobenzene and dinitrobenzene.

Common antiozonants are microcrystalline wax and paraffin wax; dibutylthiourea; 1,1,3,3-tetramethyl-2-thiourea; bis-(1,2,3,6-tetrahydrobenzaldehyde) pentaerythritolacetal; norbornenes, for example, di-5-norbornene- 2-methyl adipate, di-5-norbornene-2-methyl maleate, di-5-norbornene-2 -methyl terephthalate; N-phenyl-2 -napthylamine; polymers and resins, such as ethylene-vinyl acetate copolymer, chlorinated polyethylene, chlorosulfonated polyethylene, chlorinated ethylene-methacrylic acid copolymer, polyurethanes, polypentadienes, polybutadiene, furfural derived resins, ethylene-propylene-diene rubber and diethylene glycol ester of resin.

Conventional processing aids and softening additives may also be used. They include plasticizers such as naphthenic and paraffinic oils and other hydrocarbon oils, polymers and resins for instance, α-methylstyrene-vinyl toluene copolymers, pentaerithritol ester of hydrogenated rosin, polyterpene resins, ester resins, polyethylene waxes, polyacrylates and other polymers and resins and stearic acid.

Polymeric plasticizers may be used if compatible with the elastomeric diene. These additives are well known in the art and include liquid polybutadiene, liquid polyisoprene, liquid polybutadiene/styrene copolymer, depolymerized polybutadiene, depolymerized polyisoprene, depolymerized natural rubber, and the like. Preferably, a plasticizer is used in amounts up to about 40 php, more preferably in amounts up to about 30 php and most preferably in amounts up to about 20 php.

Colorants, such as methyl violet, methyl red and rose bengal, can be used, providing they do not strongly absorb actinic radiation nor inhibit the polymerization reaction.

The photosensitive composition can contain fillers or reinforcing agents that do not scatter actinic radiation and are preferably transparent. Suitable fillers are immiscible polymeric or nonpolymeric organic or inorganic materials, such as polystyrene, organophilic silicas, bentonites, silica, powdered glass, zinc stearate, and the like.

These photosensitive compositions can be produced in any manner known in the industry. The various components may be blended homogeneously in, for example, solution mixers, open mills, internal mixers or compounding extruders. The photosensitive composition can be formed into sheets from about 0.0005 to about 0.300 inches thick (0.013–7.62 mm) by any method known in the art, for example, solvent casting, hot pressing, calendaring or extrusion at room or elevated temperatures. The crosslinked photosensitive sheets have a hardness within the range of about 15 to about 70 Shore A hardness, preferably within the range of about 25 to about 50 Shore A, more preferably ranging from about 28 to 45 Shore A.

Photosensitive elements of the invention are usually made by affixing the sheets of the photosensitive composition to support means during their formation, usually by adhering, laminating or directly coating to the support means. The support means of the invention resist the washout solvents and typically include metals, for example, steel, tin and aluminum plates, sheets and foils as well as films or plates composed of various film-forming synthetic resins, for example, addition polymers and linear condensation polymers, such as polyamide and polyester. Preferred support means include transparent polyester films, such as polyethylene terephthalate, and are typically from 0.001 to 0.020 inch thick (0.025–0.051 mm) and preferably 0.004–0.006 inch (0.010–0.015 cm) thick. The support means can include a single support, a support with several layers of materials or multiple support layers.

To prevent excessive reflection of actinic radiation in the non-image-bearing regions, the support means may contain actinic radiation absorbing materials. The absorbing materials can be incorporated within the substrate of the support means, such as a dyed metal plate or polyester film, or layered onto the support. This absorbing or antihalation layer can be made by dispersing UV stabilizers, such as UV absorbers, organic dyes or pigments, or light quenchers in a solution or aqueous dispersion of a resin or polymer that adheres to both the support and the photosensitive composition sheet. Suitable absorbing layer materials include benzophenones, benzotriazoles, oxalanilides, pigments such as carbon black, manganese dioxide, dyes, and nickel chelates. Suitable polymeric or resin carriers include polyvinyl compounds, for example, polyvinyl chloride homopolymers and copolymers, of for example, vinyl chloride with vinyl acetate, diethyl fumarate, ethyl acrylate and copolymers of acrylic and methacrylic acid.

If an absorbing layer is used, it is preferably sandwiched between the support and the photosensitive composition. The absorbing layer is placed onto the support, after which the photosensitive composition layer is added. The absorbing layer must thus adhere both to the support and the photosensitive composition layer, while not affecting the crosslinking of the photosensitive composition.

The top of the photosensitive element is preferably protected with a thin, solvent removable coating usually paired with a removable cover sheet. The coating is applied to the photosensitive layer on its surface opposite the support means. This coating is a very thin (about 0.0002 mm thick) layer of a flexible, transparent, protective release film that is subsequently removed during washout. Examples are polyamide copolymers, vinyl acetate copolymers, copolymers of polyethylene and polyvinyl acetate, and the like. Other agents can also be used, such as silicone, fluorocarbons and waxes, as long as they are transparent and do not interfere with exposure to actinic radiation. These release films promote close contact between the element's top surface and the image bearing negative or transparency applied to the element. The close contact enhances the accuracy of the reproduction of the image on the element.

The top layer may be further protected by a cover sheet. The cover sheet is a layer of strippable sheet film placed over the coating. Examples of such films include polystyrene, polyethylene, polypropylene, polyethylene terephthalate and the like.

If desired, the photosensitive element of the invention may be back exposed, that is, exposed to actinic radiation to crosslink the non-relief backing area of the photosensitive layer. This exposure controls the relief depth, and in some cases, presensitizes the image bearing layer.

In normal use, a black and white transparency or negative containing the subject matter to be printed is placed on top of the photosensitive element after first stripping off the cover film and after any desired back exposure. A vacuum system can be used to provide good intimate contact between the negative and the surface. The element is then exposed to actinic radiation. On exposure, the transparent areas of the negative allow addition polymerization or crosslinking to take place, while the opaque areas remain uncrosslinked. Exposure is of sufficient duration to crosslink the exposed areas down to the support means or to the back exposed layer. For good results, crosslinking should occur only in the exposed areas of the element with no significant crosslinking occurring in the non-image, unexposed areas.

Actinic radiation may be provided from any light source at 200–600 nm and a wattage of 10 to 1000 watts, such as sunlight, phosphorescent discharge lamps (fluorescent lamps), carbon arc lamps, metal arc lamps such as low, medium or high pressure mercury lamps, xenon lamps, argon lamps, tungsten lamps and metal halide lamps. Preferred sources are high pressure mercury lamps, such as the very high output so-called black-light fluorescent types due to their high ratio of ultraviolet to infrared output. Exposure times may vary, depending on the photopolymerizable material, output of the lamps, distance from the lamp, the relief depth desired and the thickness of the plate.

After exposure, the uncrosslinked portions of the plate are dissolved away with any suitable solvent known in the art, leaving a flexible printing plate. Examples of suitable solvents include 2-butanone, benzene, toluene, xylene, trichloroethane, trichloroethylene, tetrachloroethylene, methylchloroform, and solvent mixtures, such as tetrachloroethylene and n-butanol, and other solvents known in the art. The washed plate is then dried and post treated.

Post treatments include detackification and post exposure, either simultaneously or in any order, and are well known in the art. Detackification can be by temporary or permanent methods. Temporary methods include dusting with fine powders like talc or cornstarch or coating with nonsilicone release fluids. Permanent methods involve the immersion of the element in an aqueous solution containing chlorine, bromine or iodine, or exposure of the element to actinic radiation at about 253 nm that is produced by germicidal lamps. Post exposure involves exposing the printing element to a black light to ensure complete photopolymerization, crosslinking and final plate hardening. Both the germicidal and blacklight lamps can be fitted into a single exposure unit for simultaneous treatment.

The resultant developed elements of the invention exhibit resistance to a wide variety of printing ink solvents normally used in flexographic printing, including water, alcohols such as ethanol and 2-propanol, 2-butoxy-ethoxyethanol, 2-ethoxyethanol, 2-propyl acetate, ketones, esters and their mixtures.

The flexographic printing plates of the invention exhibit excellent properties such as great flexibility, resilience, softness and durability which make them especially useful in the printing art. Improved flexibility of the photosensitive plates of the invention allows the developed plates to conform to the surface of the printing cylinder more exactly and remain attached during high speed printing. Greater resilience is particularly helpful for flexographic printing plates of low hardness where poor resilience requires slower printing speeds.

The photosensitive composition layer of the element of the invention has good photospeed and good exposure latitude. Good exposure latitude refers to producing sufficient relief and intaglio detail with a single face exposure time.

The following examples are illustrative of the present invention and are not intended as a limitation upon the scope thereof.

EXAMPLE 1

Photosensitive elastomer compositions for Runs No. 1 through 4 were prepared on a 12×6 in., 2-roll mill heated to 120° C. by steam. The compositions used are described in Table 1, with all components in php. The photosensitive plates were compared to a commercially available 2.84 mm thick Cyrel® PQS Plate (E.I. Dupont de Nemours and Co., Wilmington, Del.) as a standard. The Cyrel® PQS plate was made from a linear, styrene-isoprene-styrene triblock material, Kraton® D-1107 (Shell).

TABLE 1

| Run No. | 1 | 2 | 3 | 4 |
| --- | --- | --- | --- | --- |
| Block Copolymer[1] | A | B | C | D |
|  | 100 | 100 | 100 | 100 |
| Antioxidant[2] | 0.05 | 0.05 | 0.05 | 0.05 |
| Photoinitiator[3] | 1.0 | 1.0 | 1.0 | 1.0 |

[1]Block copolymer A: asymmetric, star-shaped, styrene-isoprene block copolymer. Styrene/isoprene ratio: 10/90, specific gravity: 0.93, Shore A hardness of polymer: 32, weight average molecular weight about 1.2 million. Kraton ® D-1320X (Shell)
Block Copolymer B: linear styrene-isoprene-styrene block copolymer. Styrene/isoprene ratio: 14/86, specific gravity: 0.92, Shore A hardness of polymer: 37, weight average molecular weight about 100,000. Kraton ® D-1107 (Shell)
Block Copolymer C: linear styrene-isoprene-styrene block copolymer. Styrene/isoprene ratio: 15/85, specific gravity: 0.92, Shore A hardness of polymer: 35, weight average molecular weight about 160,000. SOL T 190 (Enichem Elastomers America Inc., Monmouth Junction, NJ)
Block Copolymer D: symmetric radial styrene-isoprene block copolymer. styrene/isoprene ratio: 16/84, specific gravity: 0.92, Shore A hardness of polymer: 38, weight average molecular weight about 170,000. SOL TE 9110 (Enichem Elastomers)
[2]Tetrakis (methylene (3,5-di-t-butyl-4-hydroxy hydrocinnamate)) methane
[3]2,2-dimethoxy-2-phenylacetophenone The block copolymer was first added on the mill and worked until an even band of copolymer formed around one roll. The antioxidant was then added and blended with the copolymer for 7 minutes. Next, the photoinitiator was added and blended for 10 minutes. Finally, the blended photosensitive composition was sheeted off the rolls at approximately 3–4 mm thick.

A photosensitive, flexographic plate element was formed by pressing about a 100 gram sample between two 0.13 mm thick sheets of polyester film. The cover sheet was treated with a dry film release while a second untreated sheet of the same film formed the support sheet. The assembly was heated under pressure in a steam heated press at 120° C. for 10 minutes. The press was then cooled to room temperature and the sample removed. The top polyester sheet was removed and the top surface of the sample was sprayed with the release compound used on the cover sheet.

The plate was first tested to determine the exposure time through the back side to ultraviolet light required to form a desirable relief depth in the finished plate. Samples were cut from the sheet and were exposed in sections in 1 minute steps for up to 7 minutes in an exposure unit using UV lamps (Philips F15T8/BL) 5 cm apart placed 5 cm above the plate surface.

After back exposure, the samples were washed for 15 minutes in a rotary brush plate wash unit using a tetrachloroethylene (75%)/n-butanol (25%) solution, then dried for 2 hours at 60° C. followed by 16 hours at room temperature. The thickness of the polymer coating remaining on the polyester support was measured with a micrometer with the results summarized in Table 2.

TABLE 2

| | RESULTS | | | | |
| --- | --- | --- | --- | --- | --- |
| Run No. | 1 | 2 | 3 | 4 | Cyrel ® PQS |
| Exposure Time | Thickness of polymer coating (mm) remaining on polyester support layer | | | | |
| 1 Min | 0 | 0 | 0 | 0 | 1.22 |
| 2 Min | 0.5 | 0 | 0 | 0 | 1.65 |
| 3 Min | 1.04 | 0 | 0 | 0 | 1.90 |
| 4 Min | 1.47 | 0 | 0 | 0 | 2.11 |
| 5 Min | 2.26 | 0 | 0 | 0 | 2.26 |
| 6 Min | 2.46 | 0 | 0 | 0 | 2.44 |
| 7 Min | 2.46 | 0 | 0 | 0 | — |

The data indicate that of the four materials tested, only the asymmetric star, styrene-isoprene block copolymer composition crosslinks during exposure to UV light without ethylenically unsaturated, crosslinking agent.

A sample of photosensitive composition No. 1 and the standard Cyrel® PQS plate were each back exposed to yield a printing relief of about 1 mm. A test negative was placed on the surface of the sample opposite the support layer and held in intimate contact with the surface using a transparent plastic film under vacuum. The test negative contained images that include percentage calibrated screen tints, fine and coarse type, line and dot in both relief and intaglio. The samples were then exposed to UV light through the negative for 20 minutes.

After face exposure, the plate samples were washed for 6 minutes in a rotary brush plate wash unit using a tetrachloroethylene (75%)/n-butanol (25%) solution to remove uncrosslinked material. The washed samples were dried for 2 hours at 60° C., followed by 16 hours at room temperature. Post treatment consisted of exposure to a germicidal lamp for 7 minutes and then exposure to black light for 5 minutes.

The physical properties of flexibility and resilience of the finished plates were tested as well. Plate flexibility was measured by noting the deflection of a 15 cm×20 cm strip cut from a processed plate. The strip was mounted on the edge of a flat surface so that 5 cm of the 20 cm side was clamped to the surface while the 15 cm×15 cm strip was draped over the edge of the surface. The deflection was compared to the Cyrel® PQS plate of the same size and thickness as the plate of the invention.

Plate resilience was measured by compressing the processed plate with a rounded tip of a ball point pen and noting the plate's recovery. The recovery was compared to the recovery of a Cyrel® PQS plate of similar thickness.

The Cyrel® PQS plate was of good commercial quality. The Shore A hardness was 61.

The sample from Run No. 1 had a Shore A hardness of 38 and exhibited good retention of detail, such as fine half tone (7% at 50 lines/cm), 0.25 mm line in relief and intaglio and 0.2 mm dot in relief and intaglio. The flexibility and resilience were good.

As the results show, good photopolymer plates can be made with the asymmetric, star-shaped block copolymer without incorporating an ethylenically unsaturated crosslinking agent.

EXAMPLE 2

The photosensitive compositions for runs 5 through 8 were prepared following the procedure of Example 1 and the ingredients listed in Table 3.

TABLE 3

| Run No. | 5 | 6 | 7 | 8 |
|---|---|---|---|---|
| | Components in php | | | |
| Block Copolymer A[1] | 100 | 100 | 100 | 100 |
| Antioxidant[1] | 0.05 | 0.05 | 0.05 | 0.05 |
| Photoinitiator[1] | 1.0 | 1.0 | 1.0 | 1.0 |
| Antiozonant[2] | 1.0 | 1.0 | 1.0 | 1.0 |
| Wax[3] | 1.0 | 1.0 | 1.0 | 1.0 |
| Crosslinking Agent[4] | 0 | 0.01 | 0.1 | 1.0 |

[1]Same as in Example 1
[2]Bis-(1,2,3,6-tetrahydrobenzaldehyde)pentaerythritolacetal, VULKAZON AFS/LG, MOBAY CHEMICALS (Pittsburgh, PA)
[3]Mixed microcrystalline/paraffin wax, SUNPROOF JR, UNIROYAL CHEMICAL (Middlebury, CT)
[4]Trimethylolpropane triacrylate The photosensitive compositions of runs 5 through 8 were tested for back exposure properties as described in Example 1 with the results summarized in Table 4.

TABLE 4

| | RESULTS | | | |
|---|---|---|---|---|
| Run No. | 5 | 6 | 7 | 8 |
| Back exposure time - Thickness in polymer layer (mm) | | | | |
| 1 min | 0.33 | 0.43 | 1.52 | 2.29 |
| 2 min | 0.79 | 0.99 | 2.31 | X |
| 3 min | 1.17 | 1.47 | X | X |
| 4 min | 1.45 | 1.80 | X | X |
| 5 min | 1.70 | 2.11 | X | X |
| 6 min | 2.18 | 2.24 | X | X |

X totally crosslinked to the surface.

Plates of Runs No. 5, 6 and 7 were prepared with a 20 minute face exposure as described in Example 1 and using the same test negative. Back exposure times were chosen to give about 1 mm relief on each plate.

The plates produced from runs No. 5 and 6 exhibited good reproduction similar to the plate from Run No. 1. The plate from Run No. 7 had very fast photospeed and the intaglio and relief detail were heavily filled in. The Shore A hardness of the plates was 35.

As the results show, the addition of a small amount (<1%) of monomer greatly increases the photospeed. Good quality plates, nevertheless, can be produced using the proper exposure time.

EXAMPLE 3

The following polymer compositions were prepared using the procedure of Example 1. After the polymer was banded, the order of addition was antioxidant, antiozonant, wax and dye, thoroughly blended in, followed by processing additive, crosslinking agent and photoinitiator(s). The ingredients are listed in Table 5.

TABLE 5

| Common Components | php |
|---|---|
| Block Copolymer A[1] | 100 |
| Antioxidant[1] | 0.05 |
| Antiozonant[2] | 1.0 |
| Wax[2] | 1.0 |
| Crosslinking Agent[2] | 1.0 |
| Dye[3] | 0.005 |
| Processing Additive[4] | 5.0 |

| ADDITIONAL COMPONENTS (php) | | | |
|---|---|---|---|
| Run No. | 9 | 10 | 11 |
| Photoinitiator A[5] | 8.0 | — | — |
| Photoinitiator B[5] | — | 2.0 | — |
| Photoinitiator C[5] | — | 1.0 | — |
| Photoinitiator D[5] | — | — | 3.0 |

[1]Same as in Example 1
[2]Same as in Example 2
[3]Methyl violet
[4]α-methylstyrene/vinyltoluene copolymer
[5]Photoinitiator A: 2,2-dimethoxy-2-phenylacetophenone
Photoinitiator B: blend of benzophenone/1-hydroxycyclohexyl phenyl ketone
Photoinitiator C: blend of 2,4,6-trimethylol-benzophenone/4-methyl benzophenone/oligo-(2-hydroxy-phenyl) propane.
Photoinitiator D: 2-benzyl-2-N, N-dimethylamino-1-(4-morpholino phenyl)-1-butane Plates were produced and tested for back exposure properties as described in Example 1, with the results summarized in Table 6.

TABLE 6

| | RESULTS | |
|---|---|---|
| Run No. | Back Exposure Time for 1 mm Relief | Shore A Hardness |
| 9 | 3 min | 37 |
| 10 | 5 min | 38 |
| 11 | 3 min | 39 |

The back exposed plates were exposed step-wise for 10, 20 and 30 minutes to UV light through the test negative and processed further as described in Example 1.

Runs No. 9 and 11 produced plates with good detail and intaglio, with most detail complete at 10 minutes exposure time and totally complete at 20 minutes, including a 3% halftone dot at 52 line/cm. The 30 minutes face exposure was similar to 20 minutes. Run No. 10 was somewhat slower in photospeed with 30 minutes being required to hold all detail, but resultant plates were of good quality.

These results demonstrate that certain combinations of photoinitiator(s) and crosslinking agent produce plates of good commercial quality that were similar to those without a crosslinking agent but with a superior exposure latitude.

EXAMPLE 4

The following photosensitive compositions were made as in Example 1 while adding ingredients as listed in Table 7 in the order as described in Example 3.

TABLE 7

| Common Components | php |
|---|---|
| Block Copolymer A[1] | 100 |
| Antioxidant[1] | 0.05 |
| Antiozonant[2] | 1.0 |
| Wax[2] | 1.0 |
| Dye[3] | 0.005 |
| Processing Additive[3] | 5.0 |

| ADDITIONAL COMPONENTS (php) | | | | | | |
|---|---|---|---|---|---|---|
| Run No. | 10 | 12 | 13 | 14 | 15 | 16 |
| Photoinitiator A[3] | — | — | — | 2.0 | 2.0 | 2.0 |
| Photoinitiator B[3] | 2.0 | 2.0 | 2.0 | — | — | — |
| Photoinitiator C[3] | 1.0 | 1.0 | 1.0 | — | — | — |
| Crosslinking Agent D[4] | 1.0 | — | — | — | — | — |
| Crosslinking Agent E[5] | — | 1.0 | — | — | — | — |
| Crosslinking Agent F[6] | — | — | 1.0 | — | — | — |
| Crosslinking Agent G[7] | — | — | — | 1.0 | — | 0.6 |
| Crosslinking Agent H[8] | — | — | — | — | 1.0 | 0.4 |

[1]Same as in Example 1
[2]Same as in Example 2
[3]Same as in Example 3
[4]Trimethylopropane triacrylate
[5]Pentaerythritol triacrylate
[6]Mixed trifunctional acrylates, SARTOMER 519 (from Sartomer Co., Exton, PA)
[7]1,6 hexanediol diacrylate
[8]1,6 hexanediol dimethacrylate Plates were produced and tested for back exposure properties as described in Example 1 with results summarized in Table 8.

TABLE 8

| | RESULTS | |
|---|---|---|
| Run No. | Back Exposure Time for 1 mm Relief | Shore A Hardness |
| 10 | 5 min. | 38 |
| 12 | 1.5 min. | 40 |
| 13 | 3 min. | 38 |
| 14 | 0.75 min. | 39 |
| 15 | 4 min. | 40 |
| 16 | 1 min. | 39 |

The back exposed plates were step-wise exposed for 10, 20 and 30 minutes to UV light through the test negative and further processed as described in Example 1.

Runs No. 10 and 12 had similar retention of details, although 10 had a slower photospeed than 12. The 3% halftone dot at 52 line/cm was just held at 30 minutes exposure time. However, the remaining detail was well formed and sharp and exposure latitude was good. The plates were highly flexible and resilient, being superior to the Cyrel® PQS plate.

Run No. 13 had a slower photospeed than Run No. 12. At 30 minutes exposure, the 3% halftone dots held and the 0.2 mm isolated dots were not held. Other details, however, were well formed and sharp. Exposure latitude was good and the flexibility and resilience was similar to those of Runs No. 10 and 12.

Run No. 14 had a very fast photospeed with the finest detail held at 10 minutes exposure with no fill-in in the intaglio. The fill in of intaglio was noticeable at 20 minutes exposure, however, indicating reduced exposure latitude. The plate was less flexible than the previous runs but very resilient.

Run No. 15 exhibited a slower photospeed. Ten percent halftone required 30 minutes exposure, although the other detail was well formed. The plate was flexible and resilient, similar to Run Nos. 10 and 12.

Run No. 16 had commercially acceptable photospeed with all detail well formed and sharp at the 20 minutes exposure. The plate had good exposure latitude with a superior flexibility and resilience when compared to Runs No. 10 and 12.

This example shows that a combination of a small amount (<1%) of various types of crosslinking agents with photoinitiators produces high quality commercially acceptable plates, with improved exposure latitude and physical properties.

EXAMPLE 5

A photosensitive composition (Run No. 17) was prepared using the procedure of Example 1 and the order of ingredient addition of Example 3. The composition is described in Table 9, along with Runs No. 10, 12, and 15 for comparison.

TABLE 9

| Common Components | php |
|---|---|
| Block Copolymer A[1] | 100 |
| Antioxidant[1] | 0.05 |
| Antiozonant[2] | 1.0 |
| Wax[2] | 1.0 |
| Dye[3] | 0.005 |
| Processing Additive[3] | 5.0 |

| ADDITIONAL COMPONENTS (php) | | | | |
|---|---|---|---|---|
| Run No. | 10 | 12 | 15 | 17 |
| Photoinitiator A[3] | — | — | 2.0 | — |
| Photoinitiator B[3] | 2.0 | 2.0 | — | 2.0 |
| Photoinitiator C[3] | 1.0 | 1.0 | — | 1.0 |
| Crosslinking Agent D[4] | 1.0 | — | — | — |
| Crosslinking Agent E[5] | — | 1.0 | — | — |
| Crosslinking Agent H[6] | — | — | 1.0 | 10.0 |

[1]Same as in Example 1
[2]Same as in Example 2
[3]Same as in Example 3
[4]Trimethylopropane triacrylate
[5]Pentaerythritol triacrylate
[6]1,6 hexanediol dimethacrylate Plates of Run No. 17 were produced and tested for back exposure properties as described in Example 1 with results summarized and compared with Runs No. 10, 12 and 15 in Table 10.

TABLE 10

| | RESULTS | |
|---|---|---|
| Run No. | Back Exposure time for 1 mm Relief | Shore A Hardness |
| 10 | 5 min. | 38 |
| 12 | 1.5 min. | 40 |

TABLE 10-continued

RESULTS

| Run No. | Back Exposure time for 1 mm Relief | Shore A Hardness |
| --- | --- | --- |
| 15 | 4 min. | 40 |
| 17 | 1.5 min. | 40 |

The back exposed plates were step-wise exposed for 10, 20 and 30 minutes to UV light through the test negative and further processed and tested as described in Examples 1 and 4.

Run No. 17 had a similar photospeed and retention of detail as Run No. 15. Run No. 17 also had similar flexibility and resilience as Runs No. 10, 12 and 15.

This example shows that although a small amount (<1%) of crosslinking agent paired with a photoinitiator enhances the photospeed and exposure latitude, a tenfold increase (10 php) in crosslinking agent in the photosensitive composition of the invention has little additional effect on the photospeed or exposure latitude.

EXAMPLE 6

The following photosensitive compositions (Table 11) were prepared using the procedure of Example 1. Ingredients were added in the order of Example 3. Plasticizer was added after the processing additive and before the crosslinking agent.

TABLE 11

| Common Components | php |
| --- | --- |
| Block Copolymer A[1] | 100 |
| Antioxidant[1] | 0.05 |
| Antiozonant[2] | 1.0 |
| Wax[2] | 1.0 |
| Dye[3] | 0.005 |
| Photoinitiator B[3] | 2.0 |
| Photoinitiator C[3] | 1.0 |
| Crosslinking Agent[2] | 1.0 |

ADDITIONAL COMPONENTS (php)

| Run No. (in php) | 18 | 19 | 20 | 21 | 22 |
| --- | --- | --- | --- | --- | --- |
| Processing Additive[3] | 10.0 | — | 10.0 | — | 10.0 |
| Polymeric Plasticizer J[4] | — | 10.0 | 10.0 | — | — |
| Polymeric Plasticizer K[5] | — | — | — | 10.0 | — |
| Polymeric Plasticizer L[6] | — | — | — | — | 10.0 |

[1]Same as in Example 1
[2]Same as in Example 2
[3]Same as in Example 3
[4]Liquid polybutadiene number average molecular weight = 1,300 70% 1,2-vinyl content
[5]Liquid butadiene-styrene copolymer, 20% styrene, number average molecular weight = 2,400, 70% 1,2-vinyl content
[6]Liquid polyisoprene number average molecular weight = 16,000

Back exposure properties were determined as described in Example 1. The back exposure times were essentially the same for all with a 4 minute exposure required to yield a relief of 1 mm.

The back exposed plates were then exposed step-wise to UV light through the test negative. Face exposure times of 15, 30, and 45 minute steps were used. Further processing followed Example 1.

Run No. 18 had a slow photospeed. The 3% half tone dot was sharp, yet held only for 40 line/cm at 30 minutes exposure time. At 45 minutes exposure time, all 3% half tone held without significant loss of depth in the intaglio detail, thus indicating that exposure latitude was very good. The plate was very flexible and resilient as defined in Example 4 and the Shore A hardness was 39. The plate had superior exposure latitude, resilience and flexibility when compared to the standard Cyrel® PQS plate.

Runs No. 19, 20 and 21 were very similar to Run No. 18 in terms of photospeed and exposure latitude but were more flexible and equally resilient. These three runs had Shore A hardnesses of 33, 30 and 35, respectively.

Run No. 22 was slightly slower in photospeed than Run No. 18. Run No. 22 had no retained 3% halftone dots after a 30 minute exposure, as well as some loss of other detail such as 0.13 mm dot and straightness of 0.13 mm fine line. All this detail was retained at 45 minute exposure without any fill in so that exposure latitude appeared to be good. Flexibility and resilience was similar to Run No. 18 with a Shore A hardness of 31.

This example shows that the combination of polymeric plasticizers with the asymmetric, star-shaped block copolymer produces plates with excellent exposure latitude, flexibility and resilience.

EXAMPLE 7

A further series of tests was carried out on exposed processed samples from Runs No. 18 and 20 to determine their resistance to a range of typical solvents and solvent mixtures used in inks for flexographic printing. The results in terms of % volume swell were compared to the Cyrel® PQS standard.

TABLE 12

| Solvent | | CYREL® PLATE % Vol. Swell | RUN 18 % Vol. Swell | RUN 20 % Vol. Swell |
| --- | --- | --- | --- | --- |
| Water | 4 hr. | +1.85 | +0.84 | +0.44 |
|  | 22 hr. | +2.31 | +0.83 | 0.0 |
| 4:1 2-Propanol/ 2-Propyl acetate | 4 hr. | +2.98 | +1.76 | +0.77 |
|  | 22 hr. | +5.91 | +2.21 | −1.41 |
| 2:1 2-Propanol/ 2-Propyl acetate | 4 hr. | +6.18 | +4.51 | +4.16 |
|  | 22 hr. | +11.59 | +8.37 | +6.55 |
| 2-Propanol | 4 hr. | +1.55 | +1.08 | +0.78 |
|  | 22 hr. | +1.75 | −1.18 | −2.45 |
| 2(2-Butoxy-Ethoxy)-Ethanol | 4 hr. | +4.20 | +3.56 | +3.14 |
|  | 22 hr. | +8.40 | +6.70 | +5.52 |
| 2-Ethoxy-Ethanol | 4 hr. | +6.64 | +3.73 | +3.26 |
|  | 22 hr. | +10.89 | +6.35 | +5.67 |

The example shows that photosensitive compositions of the invention have a significantly decreased volume swell when compared to Cyrel® PQS material.

EXAMPLE 8

Prior references disclose the use of very low levels of polyvinylcinnamate as a crosslinking agent, together with Michler's ketone as a photoinitiator to produce printing plates. To reproduce such compositions, the following photosensitive compositions were prepared as described in Table 13 employing the same procedure as Example 1.

TABLE 13

| Run No. | 23 | 24A | 24B |
|---|---|---|---|
| Block Copolymer B[1] | 100 | — | — |
| Block Copolymer E[2] | — | 100 | 100 |
| Polyvinyl Cinnamate | 0.133 | 0.133 | 1.33 |
| Michler's Ketone | 0.007 | 0.007 | 0.07 |

[1]Same as in Example 1
[2]Block Copolymer E: linear styrene-butadiene-styrene block copolymer. Styrene/butadiene ratio: 28:72, Shore A hardness of polymer: 71, weight average molecular weight about 100,000.

Back exposure tests were conducted as described in Example 1. None of the runs showed any crosslinking after as much as 2 hour exposure time to a variety of light sources, including sunlight, germicidal lamp (253 nm) and black light (365 nm). All of the samples washed down to the polyester support film during washout, indicating that all the compositions were completely uncrosslinked and soluble.

EXAMPLE 9

The photosensitive compositions of the invention were also tested in blends with other thermoplastic elastomers without crosslinking agents. Polymer blend compositions were made using the non-blend ingredients of Example 1. Polymer compositions based on the block copolymer of Run No. 1 were blended with polymer compositions of Run No. 2 in amounts of 70%, 50% and 30% of polymer composition of Run No. 1 to 30%, 50% and 70% of polymer compositions of Run No. 2. Blends of Run No. 1 with Run No. 4 used the same proportions. These blends were then processed into photosensitive compositions and flexographic plates following the procedure detailed in Example 1.

The resulting blends crosslinked under the action of UV light only slightly slower than Run No. 1 alone. Both types of blends produced useful photopolymers that can be readily used in the photosensitive element.

EXAMPLE 10

The photosensitive compositions of the invention were further tested in blends with a linear styrene-butadiene-styrene block copolymer using varying amounts of polymeric plasticizer (Table 14). the photosensitive compositions were prepared using the procedure of Example 1. Ingredients were added in the order of Example 6.

TABLE 14

| Components (php) | Run No. | | |
|---|---|---|---|
| | 25 | 26 | 27 |
| Block Copolymer A[1] | 50 | 50 | 50 |
| Block Copolymer F[2] | 50 | 50 | 50 |
| Antioxidant[1] | 0.05 | 0.05 | 0.05 |
| Photoinitiator[1] | 2.0 | 2.0 | 2.0 |
| Antiozonant[3] | 1.0 | 1.0 | 1.0 |
| Wax[3] | 2.0 | 2.0 | 2.0 |
| Crosslinking Agent G[4] | 1.0 | 1.0 | 1.0 |
| Dye[5] | 0.005 | 0.005 | 0.005 |
| Processing Additive[5] | 5.0 | 5.0 | 5.0 |
| Polymeric Plasticizer J[6] | 0 | 10.0 | 20.0 |

[1]As in Example 1
[2]Block Copolymer F: linear styrene-butadiene-styrene block copolymer. Styrene/butadiene ratio: 13/87, Shore A hardness of polymer: 53, weight average molecular weight: about 100,000. Kraton ® D-1300X (Shell)
[3]As in Example 2
[4]As in Example 4
[5]As in Example 3
[6]As in Example 6

Back Exposure tests were carried out as described in Example 1. The back exposure times were essentially the same for Runs No. 25–27, with a 1.5 minute back exposure required to yield a relief of 1 mm.

The back exposed plates were step-wise exposed to 10, 20 and 30 minutes to UV light through the test negative and further processed as described in Example 1.

All materials tested exhibited commercially acceptable photospeed and had similar retention of detail. The 3% halftone dot at 52 lines/cm was just held at a 30 minutes exposure time. The remaining detail, however, was well formed and sharp and the exposure latitude was good.

The Shore A hardness of Runs No. 25–27 varied. Run No. 25 had a Shore A hardness of 52. Run No. 26 was 45 Shore A and Run No. 27 was 40 Shore A.

This example demonstrates that blends of the asymmetric, star-shaped, block copolymer and a linear styrene-butadiene-styrene block copolymer with a polymeric plasticizer produce photopolymers of varying Shore A hardnesses having similar photospeed, retention of detail and exposure latitude.

EXAMPLE 11

Three compositions are prepared with block copolymer G (Runs No. 28, 29 and 30) following the procedure of Example 1. Block copolymer G is an asymmetric, star-shaped, styrene-butadiene block copolymer with a styrene content about 15% and a weight average molecular weight about 1 million. Block copolymer G is substituted for block copolymer A in Run No. 1 of Example 1 (Run No. 28) and Runs No. 18 and 20 of Example 6 (Runs No. 29 and 30, respectively).

Back exposure tests are carried out as described in Example 1. Plate samples from Runs No. 28–30 are then back exposed to give a relief of 1 mm and are further step-wise face exposed for 15, 30 and 45 minutes to UV light through the test negative and processed as described in Example 1.

Compared to photopolymer compositions in Runs No. 1, 18 and 20, based on the asymmetric, star-shaped, styrene-isoprene block copolymer, Runs No. 28, 29 and 30 should exhibit slower photospeed. Although the plates should have good exposure latitude, exposure times of 45 minutes may be necessary hold fine detail. Hardness of the resultant plates from Runs No. 28–30 should be approximately 15 points Shore A higher than those of their styrene-isoprene counterpart.

The above photosensitive compositions have utility in raised image printing processes such as letterpress, letterset and flexographic printing. Printing elements of the invention render high quality images on many difficult surfaces, such as corrugated cardboard, foils, metals and plastics.

While the invention is shown in only some of its forms, it is not thus limited but is susceptible to various changes and modifications without departing from the spirit and scope of the invention.

What is claimed is:

1. In a process for making a printing plate, the process comprising the steps of:
    (a) imagewise exposing to actinic radiation a photosensitive printing element comprising support means having thereon a layer of a photosensitive composition;
    (b) removing the unexposed portions of the imagewise exposed layer with a solvent to form a printing plate; and (c) post development treating the printing plate; wherein the improvement comprises using a photosensitive composition comprising a crosslinking photointiator; a thermoplastic, elastomeric, asymmetric, star-shaped block copolymer having an asymmetric, star-shaped structure $(A-B)_m-X-(C)_n$ wherein A is a polymer block of a monoalkenyl arene, B is a polymer block of a conjugated diene, C is a polymer block of a conjugated diene, X is the residue of a multi-functional coupling agent, $3<m+n\leq40$, the weight average molecular weight of each block A is between about 3,000 and about 125,000 and the weight average molecular weight of each block B and block C is between about 15,000 and about 250,000; and a limited amount of an ethylenically unsaturated, crosslinking agent, the ethylenically unsaturated, crosslinking agent being present in the range from 0 to about 1 part by weight per hundred parts by weight asymmetric, star-shaped block copolymer.

2. The method of claim 1, wherein the crosslinking photoinitiator is present in the range of about 0.1 to about 15 parts by weight per hundred parts by weight asymmetric, star-shaped, block copolymer.

3. The method of claim 1, wherein block A is polystyrene and blocks B and C are polyisoprene or polybutadiene.

4. The method of claim 1, wherein the residue of the multi-functional coupling agent is a residue of divinylbenzene.

5. The method of claim 1, wherein the printing plate is resilient and flexible.

* * * * *